(12) United States Patent
Hino et al.

(10) Patent No.: US 6,820,246 B2
(45) Date of Patent: Nov. 16, 2004

(54) PATTERN LAYOUT METHOD OF SEMICONDUCTOR DEVICE

(75) Inventors: Yoshinori Hino, Gunma (JP); Naoei Takeishi, Niigata (JP); Yoshitaka Haraguchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 117 days.

(21) Appl. No.: 10/080,823

(22) Filed: Feb. 21, 2002

(65) Prior Publication Data

US 2002/0120911 A1 Aug. 29, 2002

(30) Foreign Application Priority Data

| Feb. 28, 2001 | (JP) | ................................. P 2001-053627 |
| Feb. 28, 2001 | (JP) | ................................. P 2001-053628 |
| Mar. 6, 2001 | (JP) | ................................. P 2001-061828 |

(51) Int. Cl.$^7$ .......................... G06F 17/50; G02F 1/136; H01L 29/08; H04N 5/14; H04N 9/64
(52) U.S. Cl. ............................ 716/10; 716/12; 349/43; 349/49; 348/571; 257/57; 257/72
(58) Field of Search ....................... 716/10, 12; 257/57, 257/72; 348/571; 349/43, 49

(56) References Cited

U.S. PATENT DOCUMENTS

| 4,214,269 A | * | 7/1980 | Parker et al. ............... 348/442 |
| 4,447,881 A | * | 5/1984 | Brantingham et al. ......... 716/17 |
| 4,833,620 A | * | 5/1989 | Takahashi ..................... 716/4 |
| 5,488,583 A | * | 1/1996 | Ong et al. ................... 365/201 |
| 5,680,191 A | * | 10/1997 | Voisin et al. ............... 349/150 |
| 5,699,073 A | * | 12/1997 | Lebby et al. ................. 345/82 |
| 5,754,171 A | * | 5/1998 | Stoller ........................ 345/205 |
| 5,757,654 A | * | 5/1998 | Appel ............................ 716/1 |
| 6,008,821 A | * | 12/1999 | Bright et al. ................ 345/504 |
| 6,256,604 B1 | * | 7/2001 | Yabe et al. .................. 703/14 |
| 6,304,241 B1 | * | 10/2001 | Udo et al. .................... 345/96 |
| 6,470,475 B2 | * | 10/2002 | Dubey ............................ 716/1 |
| 6,550,047 B1 | * | 4/2003 | Becker ........................... 716/8 |

FOREIGN PATENT DOCUMENTS

| JP | 63209141 A | * | 8/1988 | ............ H01L/21/82 |
| JP | 02005292 A | * | 1/1990 | ............ G11C/11/41 |
| JP | 02078268 A | * | 3/1990 | ............ H01L/27/10 |
| JP | 02183558 A | * | 7/1990 | ............ H01L/27/04 |
| JP | 04144276 A | * | 5/1992 | ............ H01L/27/10 |
| JP | 07211075 A | * | 8/1995 | ............ G11C/11/41 |
| JP | 10256512 A | * | 9/1998 | ......... H01L/27/108 |
| JP | 11054726 A | * | 2/1999 | ......... H01L/27/108 |
| JP | 11068059 A | * | 3/1999 | ......... H01L/27/108 |
| JP | 11086531 A | * | 3/1999 | ......... G11C/11/401 |
| JP | 11154708 A | * | 6/1999 | ............ H01L/21/82 |
| WO | WO 9858410 A1 | * | 12/1998 | ............ H01L/27/10 |

OTHER PUBLICATIONS

NB8909290, "Method to Improve Chip Wiring", IBM Technical Disclosure Bulletin, vol. 32, No. 4B, Sep. 1989, pp. 290–293 (6 pages).*

Nakamura et al., "A 29–ns 64–Mb DRAM With Herarchical Array Archictecture", IEEE Journal of Solid–State Circuits, vol. 31, No. 9, Sep. 1996, pp. 1302–1307.*

Wada et al., "Variable Bit Organization as a New Test Function for Standard Memories", IEEE Journal of Solid–State Circuits, vol. 26, No. 1, Jan. 1991, pp. 51–54.*

Mulder et al., "An Area Model for On–Chip Memories and its Application", IEEE Journal of Solid–State Circuits, vol. 26, No. 2, Feb. 1991, pp. 98–106.*

* cited by examiner

*Primary Examiner*—Leigh M. Garbowski
*Assistant Examiner*—Phallaka Kik
(74) *Attorney, Agent, or Firm*—Fish & Richardson P.C.

(57) ABSTRACT

In the driver for driving display having an anode driver, a cathode driver, and memory portions of a semiconductor device of the invention, anode driver regions connected to the memory portions are laid out equally in the chip, and SRAMs are arranged equally in the vicinity of each of anode driver regions so that drawing of wiring becomes easy and size of the chip is miniaturized.

17 Claims, 16 Drawing Sheets

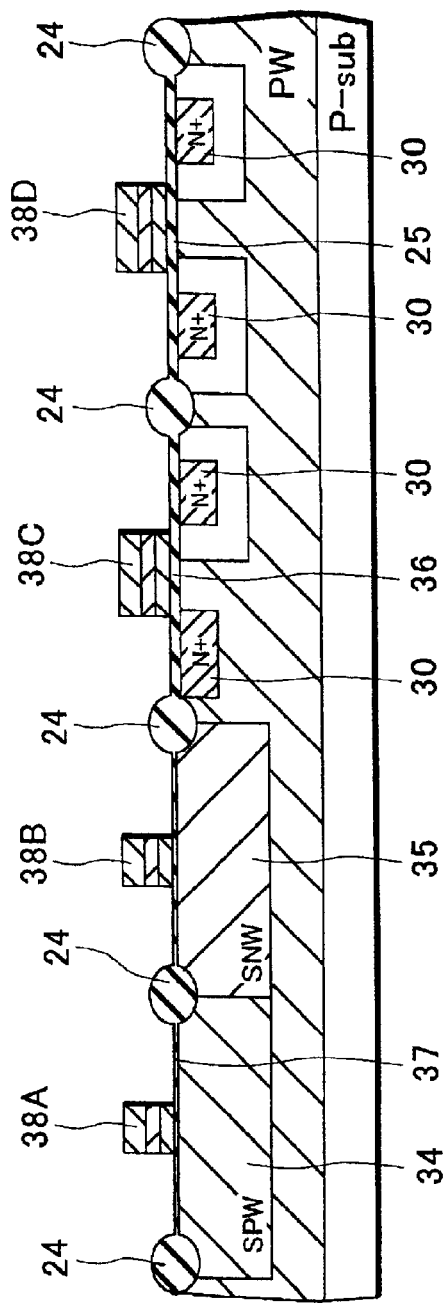
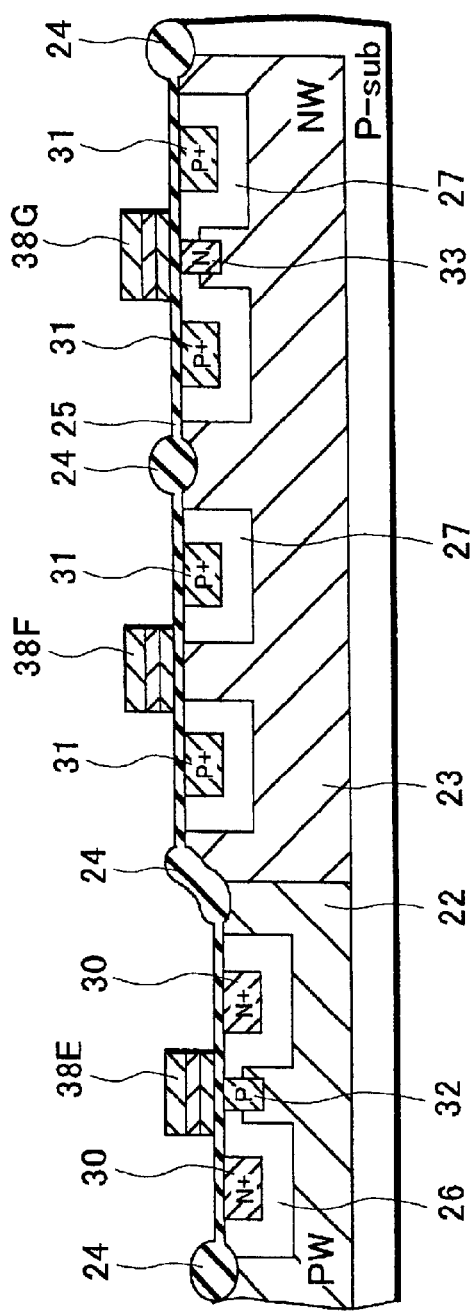
FIG.8A
FIG.8B

PATTERN LAYOUT METHOD OF SEMICONDUCTOR DEVICE

BACKGROUND OF THE INVENTION

The present invention relates to a pattern layout method of a semiconductor device, particularly a pattern layout method of the semiconductor deice construction of a display driver and the like having an anode driver and a cathode driver for example and making them in one chip.

A semiconductor device constituting the above-mentioned display driver and the like will be described referring a drawing.

In the above-mentioned display, there are various kinds of flat panel displays such as an LCD, an LED display, an organic EL (Electroluminescence) display, an inorganic EL display, a PDP (Plasma Display Panel), an FED (Field Emission Display), and so on.

An organic EL display driver will be described below as an example, which has an anode driver and a cathode driver for example, supplies constant current to the organic EL element, and makes the organic EL element emit light. Since the EL element has many merits such that a back light required in a liquid crystal display is not necessitated because of self-luminescence and that there is not limit about visual field angle, application for display device of next generation is expected. Especially, it is known that the organic EL element is possible in high brightness and superior than an inorganic EL element in high efficiency, high response characteristic, and multiple color.

The above-mentioned organic EL display driver includes logic N-channel MOS transistor and P-channel MOS transistor, N-channel high-voltage MOS transistor and P-channel high-voltage MOS transistor of high withstand voltage, N-channel high-voltage MOS transistor and P-channel high-voltage MOS transistor of high withstand voltage reduced in on-resistance, N-channel MOS transistor for a level shifter, and so on. Here, a DMOS (Double-diffused Metal-Oxide Semiconductor) transistor and the like are used for the high-voltage MOS transistor reduced in on-resistance for example. In the above-mentioned DMOS transistor construction, new diffusion region is formed by diffusing impurity different in conductive type to diffusion region formed at surface side of semiconductor substrate and difference of vertical direction diffusion of these diffusion regions is used as effective channel length so that the transistor is an element suitable for low on-resistance by forming short channel.

A pattern layout of a semiconductor device at constituting various kinds of drivers such as the above-mentioned the organic EL display driver has constitution where required numbers of output of layouts for one bit output are arranged repeatedly.

Here, an anode driver, a cathode driver, a memory portion, and the like are constituted separately at constitution of the above-mentioned organic EL display driver. Because of that, mounting them in one printing board is not satisfied in cost and size.

It is desired to design miniaturization of chip size and low cost by making the anode driver, the cathode driver, the memory portion, and the like in one chip.

Further, in the constitution only arranging various kinds of drivers repeatedly times of necessary number of outputs, space for drawing wiring around and the like is need so as to bring enlargement of chip size.

That is, FIG. 17A is a plane view showing a pattern layout of a semiconductor device constituting for driving display, and layouts for output one bit are arranged repeatedly times of necessary number of outputs as above-mentioned.

Here, numeral 1 in FIG. 17A denotes an output region corresponding to one bit, and a driver portion having desired number of outputs is constituted arranging plural output 3 regions 1 for the one bit. Numeral 2 denotes wiring for a gate electrode formed in the output regions 1, and source region (S) and drain region (D) are formed to be adjacent to the wiring for the gate electrode (See the enlarged figure in the circle of FIG. 17A).

The shape of the wiring 2 for gate electrode shown in FIG. 17A is only an example, and various kinds of wiring for gate electrodes 2B, 2C, and 2D shown in FIGS. 17B, 17C, and 17D may be constituted. The above-mentioned constitution arranging layout for output one bit repeatedly times of necessary number of outputs does not respond to a request for further multi bits at making in one chip because of the problem of inconvenience of drawing wiring around and taking space of drawing it around.

Furthermore, a problem of variation between bits rises as multi bits advance. That is, the variation between bits causes to generate micro-loading effect by difference between fineness and roughness of gate electrode forming pattern, and occasionally finishing shape and working dimension of the gate electrode go wrong by the effect.

Especially, when the organic EL display driver having the anode driver, the cathode driver, and the like as above-mentioned are made in one chip, each driver portion is mounted mixedly naturally. Therefore, the above-mentioned difference between fineness and roughness of the gate electrode forming pattern becomes large, micro-loading effect generates easily at photolithography and etching, variation of finishing shape and working dimension of the gate electrode caused by the effect becomes large, and being out of order in display generates.

SUMMARY OF THE INVENTION

According to a first aspect of the present invention, in the pattern layout method of the semiconductor device of the present invention, desired drivers connected to the memory portions are laid out equally in the chip and each memory portion is arranged equally in the vicinity of each driver laid out equally in the semiconductor device made in one chip with an anode driver, a cathode driver, and memory portions.

Preferably, the desired drivers connected to the memory portions are divided into plural groups and each memory portion is arranged in every group.

Further, the desired drivers connected to the memory portions are placed face to face at right and left positions or high and low positions, and each memory portion is arranged at center portion of the chip.

Moreover, the semiconductor constitutes each transistor for a driver and the each dummy pattern is formed to be adjacent to the end portion of the output bit group constituting a cathode driver, an anode driver, and an anode driver for icon.

Further, the dummy pattern is formed at an empty space in a region where the plural output bits are arranged.

Moreover, number of outputs of the dummy pattern formed at a region where output bit groups constituting the cathode driver, the anode driver, and the anode driver for icon are adjacent each other is less than number of outputs of the dummy pattern formed at a region where output bit groups are not adjacent each other.

Further, the dummy pattern has the same shape as wiring for gate electrode.

According to the second aspect of the invention, in the pattern layout method of the semiconductor device, plural output groups are arranged at periphery portion in the chip for drivers where plural output regions corresponding to one bit are arranged to constitute desired output bit group and made in one chip.

Preferably, wiring connected to each output bit arranged at the periphery portion is wired so as to circle fitting shape of the chip.

Further, the pattern layout method of the semiconductor device is applied to display drivers where drivers, memory portions, etc. are made in one chip, and the drivers are arranged at periphery portion in the chip in the state of grouping by every desired output bit group, and wiring connected to each output bit arranged at the periphery portion is wired so as to circle fitting shape of the chip.

Moreover, the drivers are anode drivers and cathode drivers, and the anode drivers or cathode drivers are arranged at periphery portion in the chip in the state of grouping by every desired output bit group, and that wiring connected to each output bit arranged at the periphery portion is wired so as to circle fitting shape of the chip.

Further, the wirings are a power source line and a signal line, and moreover, that the each output bit group is arranged so as to surround the memory portions at the periphery portion.

Moreover, the semiconductor constitutes each transistor for a driver and the each dummy pattern is formed to be adjacent to the end portion of the output bit group constituting a cathode driver, an anode driver, and an anode driver for icon.

Further, the dummy pattern is formed at an empty space in a region where the plural output bits are arranged.

Furthermore, number of outputs of the dummy pattern formed at a region where output bit groups constituting the cathode driver, the anode driver, and the anode driver for icon are adjacent each other is less than number of outputs of the dummy pattern formed at a region where output bit groups are not adjacent each other.

Further, the dummy pattern has the same shape as wiring for gate electrode.

BRIEF DESCRIPTION OF THE DRAWINGS

FIGS. 8A and 8B are sectional views showing a method for manufacturing a semiconductor device according to the embodiment of the invention;

DETAILED DESCRIPTION OF THE PREFERRED EMBODIMENT

An embodiment of the invention according to a semiconductor device and a pattern layout method thereof will be described below with reference to the drawings. In this embodiment, an organic EL display is shown as an example, and a semiconductor device mounted with various kinds of MOS transistors constituting the organic EL display driver is described.

Figure 10A:
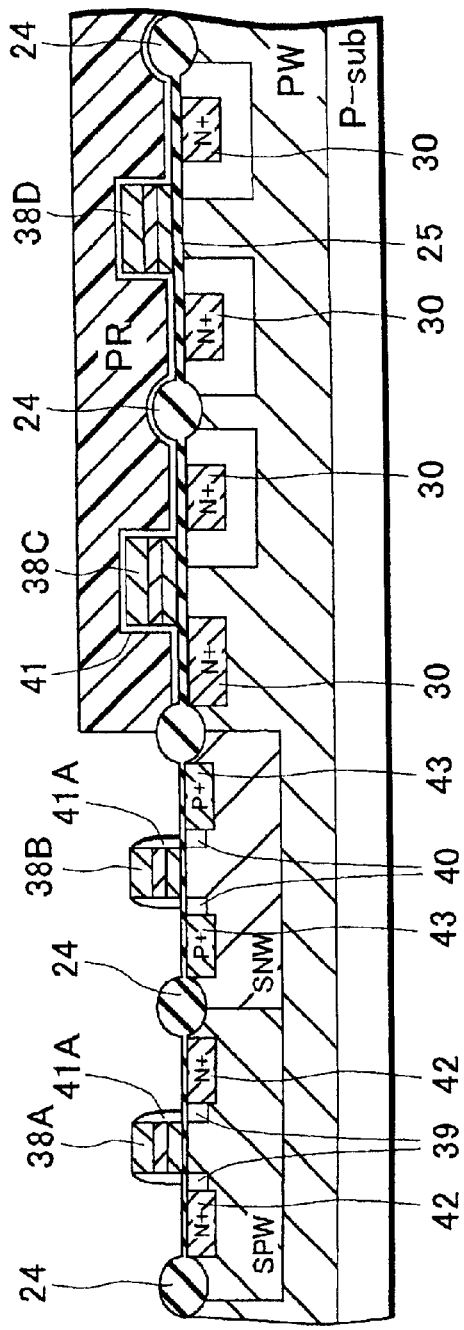
FIGS. 10A and 10B are sectional views showing a method for manufacturing a semiconductor device according to the embodiment of the invention.
Figure 10B:
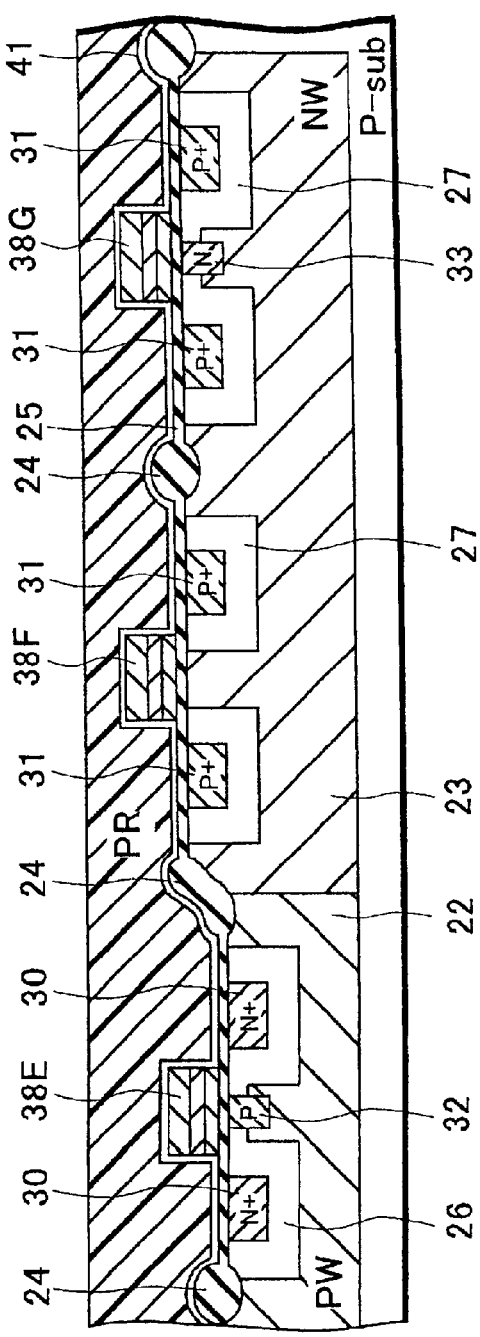

The organic EL display driver is configured with, as viewed from the left in FIG. 10A, logic N-channel MOS and P-channel MOS transistors (e.g. on 3 V), an N-channel MOS transistor (e.g. on 30 V) for a level shifter and an N-channel high-voltage MOS transistor of high withstand voltage (e.g. on 30 V) and, as viewed from the left in FIG. 10B, an N-channel high-voltage MOS transistor of high withstand voltage (e.g. on 30 V) reduced in on-resistance, a P-channel high-voltage MOS transistor of high withstand voltage (e.g. on 30 V) and a P-channel high-voltage MOS transistor of high withstand voltage (e.g. on 30 V) reduced in on-resistance. Note that, in the below explanation, the MOS high-voltage transistor reduced in on-resistance is referred to as an SLED (Slit channel by counter doping with extended shallow drain) MOS transistor in order to differentiate between the high-voltage MOS transistor and the high-voltage MOS transistor reduced in on-resistance, for the sake of explanation.

In the semiconductor device mounted with various MOS transistors constituting such an organic EL display driver, as shown in FIGS. 10A and 10B, an N type well region 23 forming the P-channel high-voltage transistor and the P-channel high-voltage SLEDMOS transistor reduced in on-resistance is configured in a step higher region, while a P type well region 22 forming the other MOS transistors is configured in a step lower region. In other words, structuring is made to arrange the precise logic (e.g. 3 V) N-channel MOS and P-channel MOS transistors in the step lower region.

Explanation is made below on a method of manufacturing a semiconductor device mounted with various transistors constituting the display driver described above.

Figure 1A:
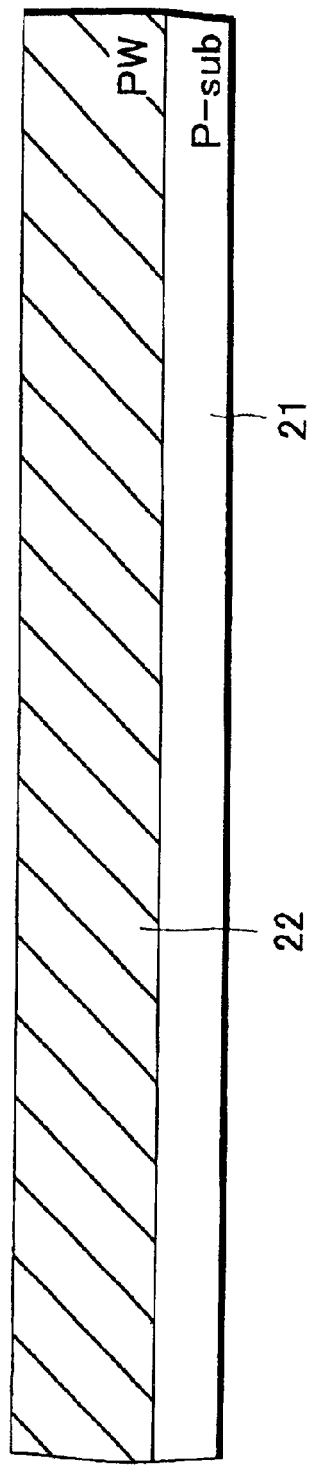
FIGS. 1A and 1B are sectional views showing a method for manufacturing a semiconductor device according to the embodiment of the invention.
Figure 1B:
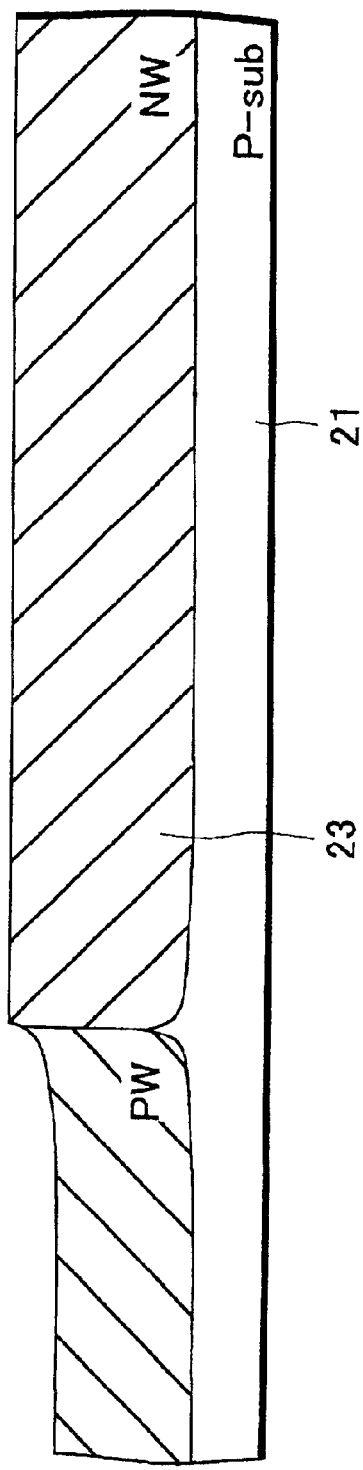

In FIGS. 1A and 1B, in order to define a region for forming various MOS transistors, a P type well (PW) 22 and an N type well (NW) 23 are first formed using LOCOS technique, e.g. in a p type semiconductor substrate (P-sub).

That is, although explanation with showing is omitted, a pad oxide film and a silicon nitride film are formed on the well region of the semiconductor substrate 21. The pad oxide film and silicon nitride film is used as a mask to ion-implant boron ion, for example, at an acceleration voltage of approximately 80 keV and a dose of $8\times10^{12}/cm^2$, thereby forming an ion-implant region. Thereafter, the silicon nitride film is used as a mask to oxidize the substrate surface by the LOCOS technique, thereby forming a LOCOS film. At this time, the boron ion implanted in a region beneath the LOCOS film is diffused toward the inward of the substrate to form a P type region.

Next, the pad oxide film and the silicon nitride film are removed. Thereafter, the LOCOS film is used as a mask to ion-implant phosphorus ion to the substrate surface, at an acceleration voltage of approximately 80 keV and a dose of $9\times10^{12}/cm^2$, thereby forming an ion-implant region 15. Then, the LOCOS film is removed away. Thereafter, the impurity ions implanted in the substrate are thermally diffused to form a P type well and N type well. Thus, as shown in FIGS. 1A and 1B, the P type well 22 formed in the substrate 21 is arranged in a step lower region while the N type well is arranged in a step higher region.

Figure 2A:
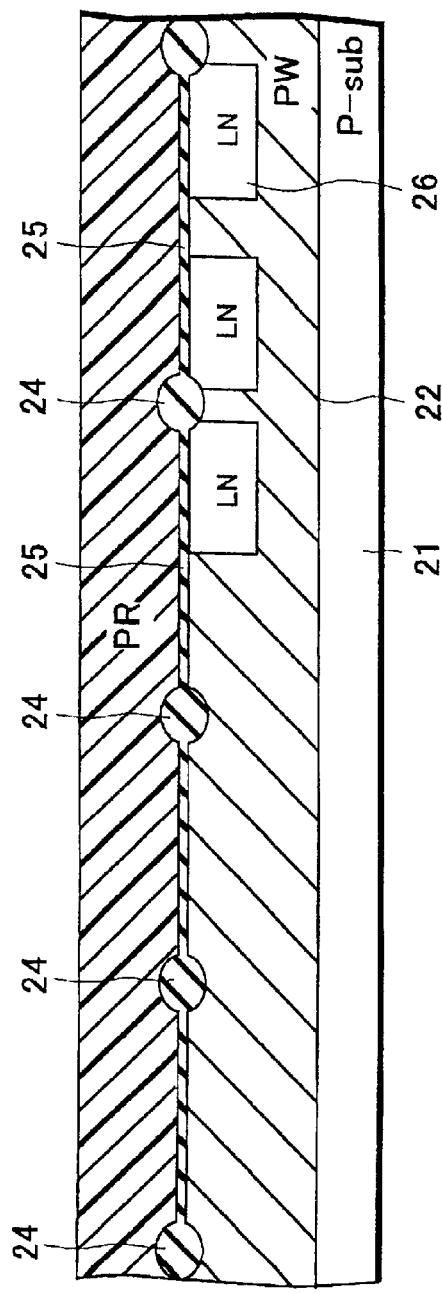
FIGS. 2A and 2B are sectional views showing a method for manufacturing a semiconductor device according to the embodiment of the invention.
Figure 2B:
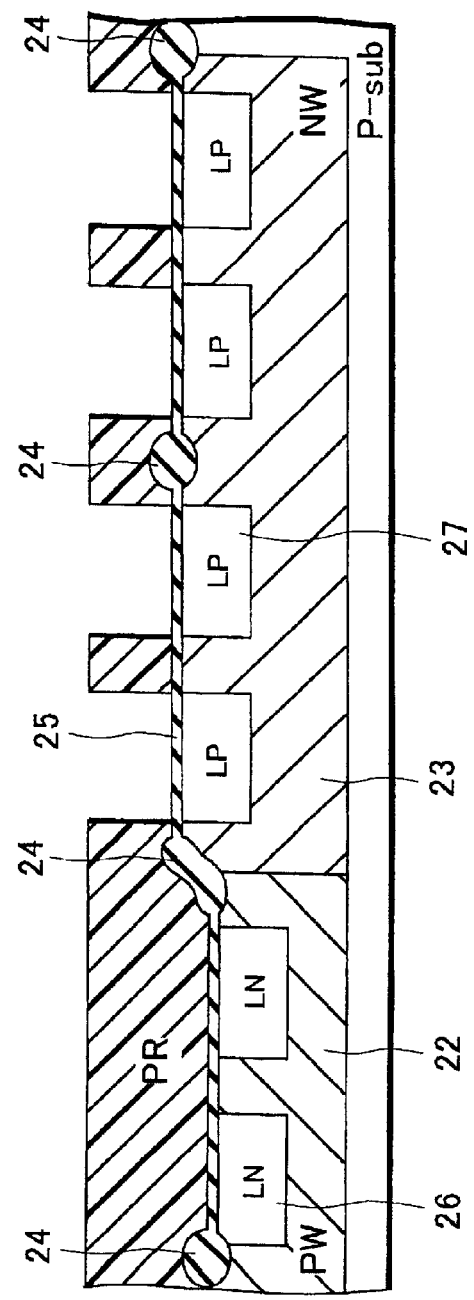

Next, in FIGS. 2A and 2B, a device isolation film 24 is formed to an approximately 500 nm by the LOCOS process in order for device isolation based on the MOS transistor. A thick gate oxide film 25 for withstanding high voltage is formed by thermal oxidation in a thickness of approximately 80 nm on an active region excepting the device isolation region.

Subsequently, the resist film is used as a mask to form first low-concentration N type and P type source/drain regions (hereinafter, referred to as LN region 26, LP region 27). Namely, in a state covering the region of other than an LN region by a not-shown resist film, phosphorus ion, for example, is first ion-implanted to the substrate surface layer at an acceleration voltage of 120 keV and a dose of $8\times10^{12}/cm^2$ thereby forming an LN region 26. Thereafter, in a state covering the region of other than an LP region by a resist film (PR), boron ion, for example, is ion-implanted to the substrate surface layer at an acceleration voltage of 120 keV and a dose of $8.5\times10^{12}/cm^2$ thereby forming an LP region 27. Note that, in actual, the implanted ionic species will be thermally diffused into a LN region 26 and LP region 27 through an anneal process as a later process (e.g. in an $N_2$ atmosphere at 1100° C. for 2 hours).

Figure 3A:
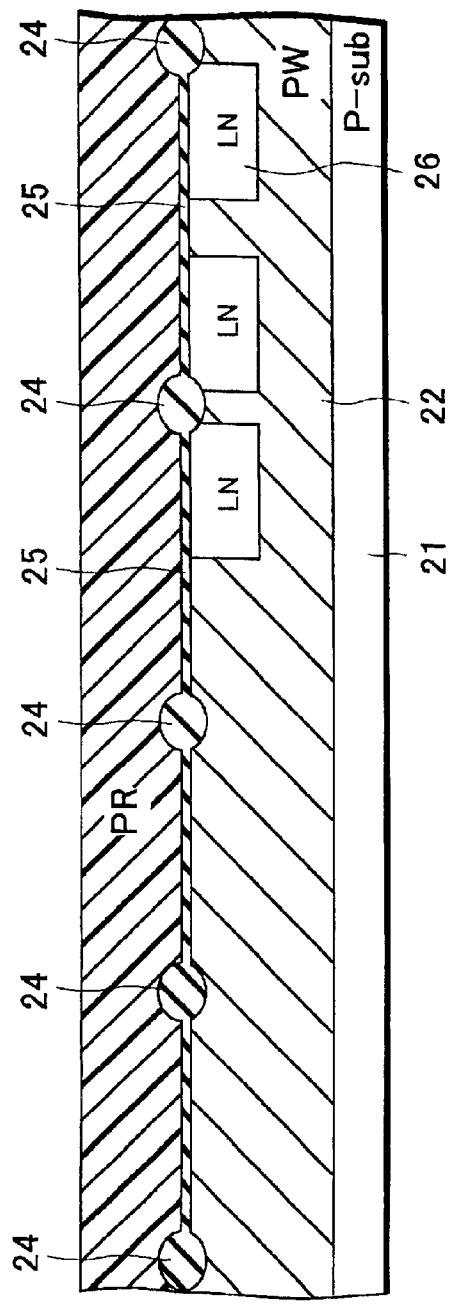
FIGS. 3A and 3B are sectional views showing a method for manufacturing a semiconductor device according to the embodiment of the invention.
Figure 3B:
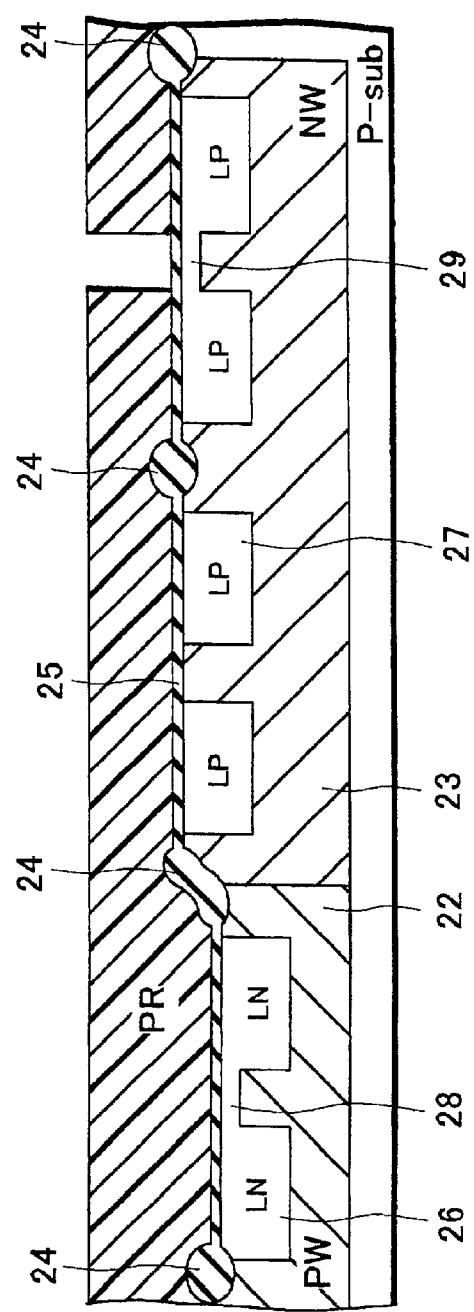

Subsequently, in FIGS. 3A and 3B, using as a mask a resist film at between the LN regions 26 and the LP regions 27 forming the regions for P-channel and N-channel SLED-MOS transistors, second low-concentration N type and P type source/drain regions (hereinafter, referred to as SLN region 28 and SLP region 29) are formed. Namely, in a state covering the region other than the region for an SLN region by a not-shown resist mask, phosphorus ion, for example, is first ion-implanted to the substrate surface layer at an acceleration voltage of 120 keV and a dose of $1.5\times10^{12}/cm^2$ to form an SLN region 28 continuing the LN regions 26. Then, in a state covering the other region of the SLP region by a resist film (PR), boron difluoride $^{49}BF_2^+$), for example, is ion-implanted to the substrate surface region at an acceleration voltage of 140 keV and a dose of $2.5\times10^{12}/cm^2$ to form an SLP region 29 continuing the LP regions 27. Note that the LN region 26 and the SLN region 28 or the LP region 27 and the SLP region 29 are set nearly equal in impurity concentration or higher in either one.

Figure 4A:
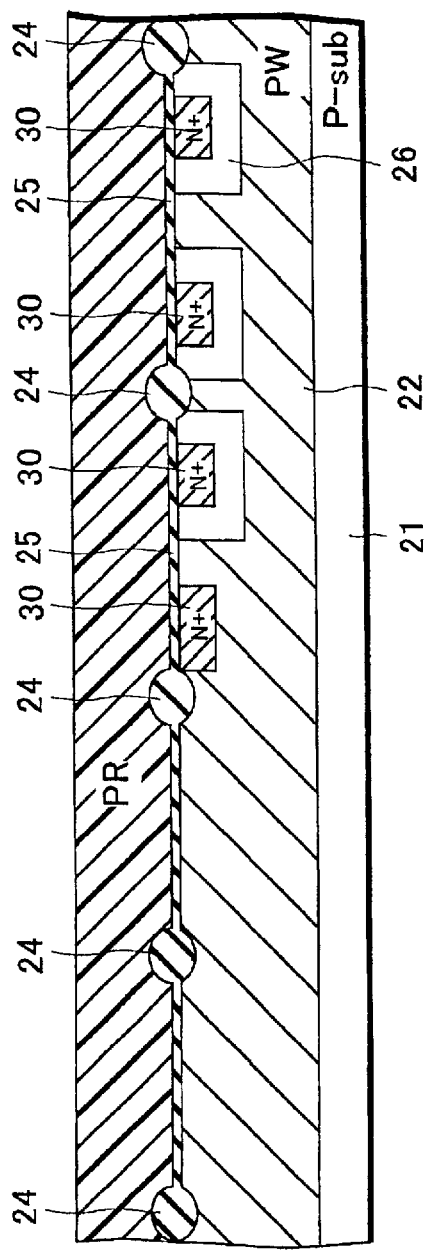
FIGS. 4A and 4B are sectional views showing a method for manufacturing a semiconductor device according to the embodiment of the invention.
Figure 4B:
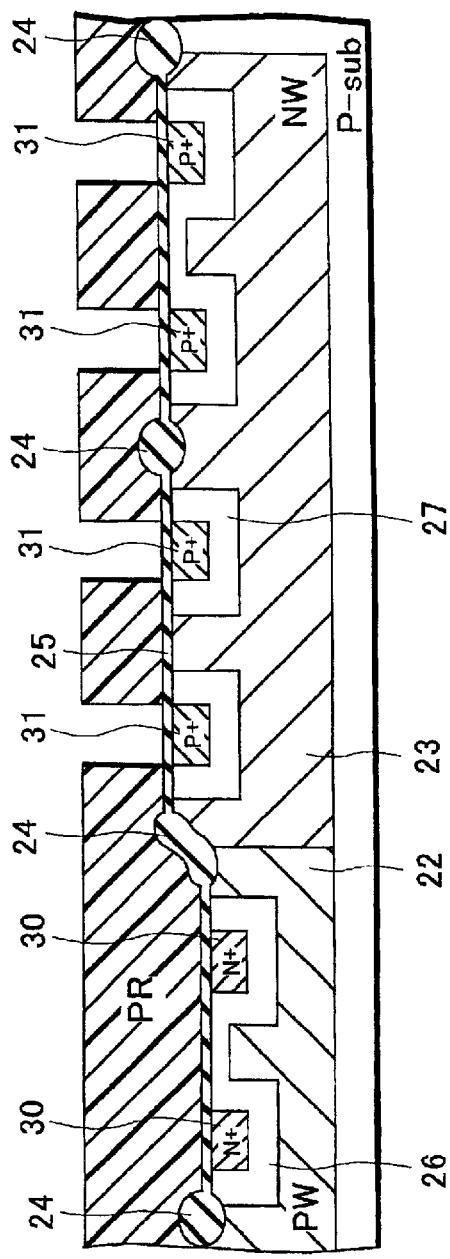

Furthermore, in FIGS. 4A and 4B, a resist film is used as a mask to form high-concentration N type and P type source/drain regions (hereinafter, referred to as N+ region 30, P+ region 31). Namely, in a state covering the other region than a region for an N+ region by a not-shown resist film, phosphorus ion, for example, is first ion-implanted to the substrate surface layer at an acceleration voltage of 80 keV and a dose of $2\times10^{15}/cm^2$ thereby forming an N+ region 30. Thereafter, in a state covering the other region than a region for a P+ region by a resist film (PR), boron difluoride ion, for example, is ion-implanted to the substrate surface layer at an acceleration voltage of 140 keV and a dose of $2\times10^{15}/cm^2$ thereby forming a P+ region 31.

Figure 5A:
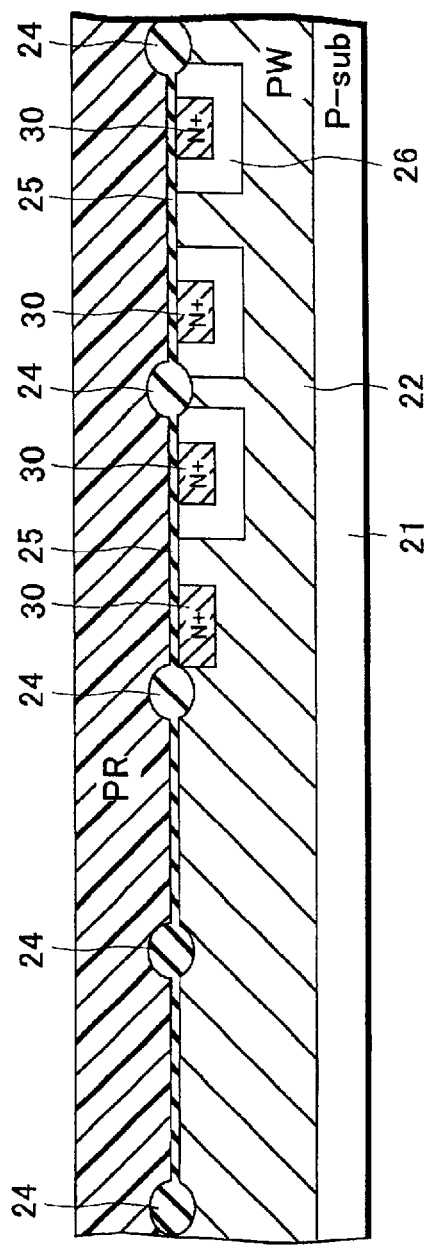
FIGS. 5A and 5B are sectional views showing a method for manufacturing a semiconductor device according to the embodiment of the invention.
Figure 5B:
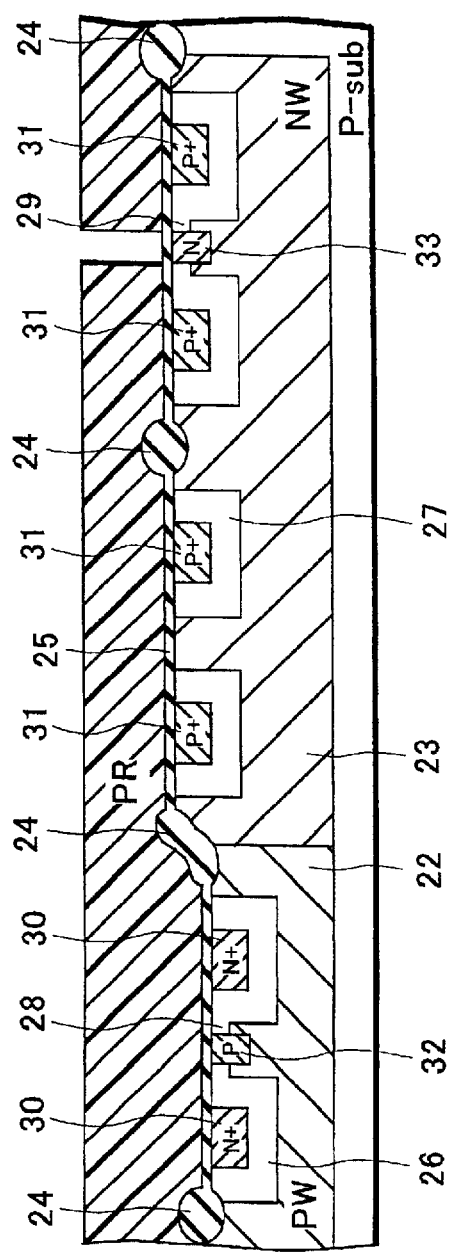

Next, in FIGS. 5A and 5B, using as a mask a resist film having an opening diameter smaller than the mask opening diameter (see FIG. 3) for forming the SLN region 28 and SLP region 29, opposite-conductivity type impurities are ion-implanted to a central area of the SLN region 28 continuing the LN regions 26 and to a central area of the SLP region 29 continuing the LP regions 27, thereby forming a P type body region 32 and an N type body region 33 to respectively separate the SLN region 28 and the SLP region 29. Namely, in a state covering the other region than the region for a P type region by a not-shown resist film, boron difluoride ion, for example, is first ion-implanted to the substrate surface layer at an acceleration voltage of 120 keV and a dose of $5\times10^{12}/cm^2$ thereby forming a P type body region 32. Thereafter, in a state covering the other region than the region for an N type region by a resist film (PR), phosphorus ion, for example, is ion-implanted to the substrate surface layer at an acceleration voltage of 190 keV and a dose of $5\times10^{12}/cm^2$ thereby forming an N type body region 33. Note that the operation processes concerning ion implant shown in FIGS. 3A to 5B may be properly changed in order. The P type body region 32 and the N type body region 33 each will be constituted with a channel in a surface region thereof.

Figure 6A:
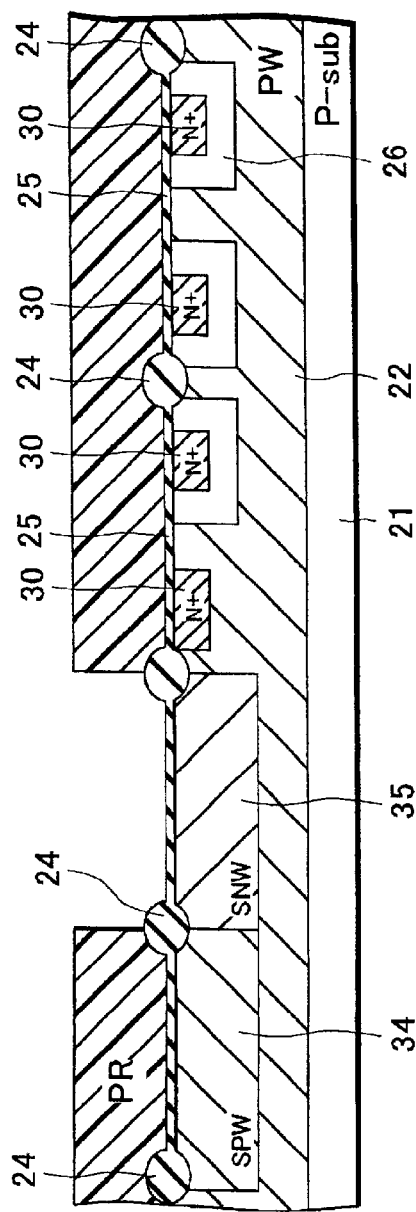
FIGS. 6A and 6B are sectional views showing a method for manufacturing a semiconductor device according to the embodiment of the invention.
Figure 6B:
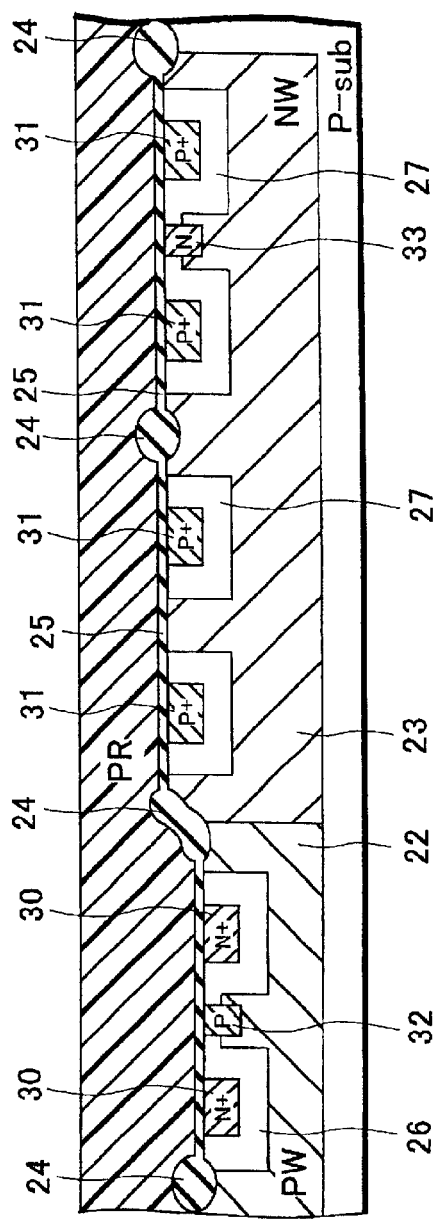

Furthermore, in FIGS. 6A and 6B, a second P type well (SPW) 34 and a second N type well (SNW) 35 are formed in the substrate (P type well 22) at a region for precise N-channel and P-channel MOS normal-voltage transistors.

Namely, using a not-shown resist film having an opening in the region for an N-channel normal-voltage MOS transistor as a mask, boron ion, for example, is ion-implanted to the P type well 22 at an acceleration voltage of approximately 190 keV and a dose of (first implant condition) $1.5\times10^{13}/cm^2$. Thereafter, boron ion is again ion-implanted at an acceleration voltage of approximately 50 keV and a dose of (second implant condition) $2.6\times10^{12}/cm^2$, thus forming a second P type well 34. Also, using a resist film (PR) having an opening in the region for a P-channel normal-voltage MOS transistor as a mask, phosphorous ion, for example, is ion-implanted to the P type well 22 at an acceleration voltage of approximately 380 keV and a dose of $1.5\times10^{13}/cm^2$, thereby forming a second N type well 35. Note that, where a high-acceleration voltage generating apparatus having nearly 380 keV is not available, it is satisfactory to use a double charge scheme for ion-implant two-valence phosphorus ion at an acceleration voltage of approximately 190 keV and a dose of $1.5\times10^{13}/cm^2$. Subsequently, phosphorus ion is ion-implanted at an acceleration voltage of approximately 140 keV and a dose of $4.0\times10^{12}/cm^2$.

Figure 7A:
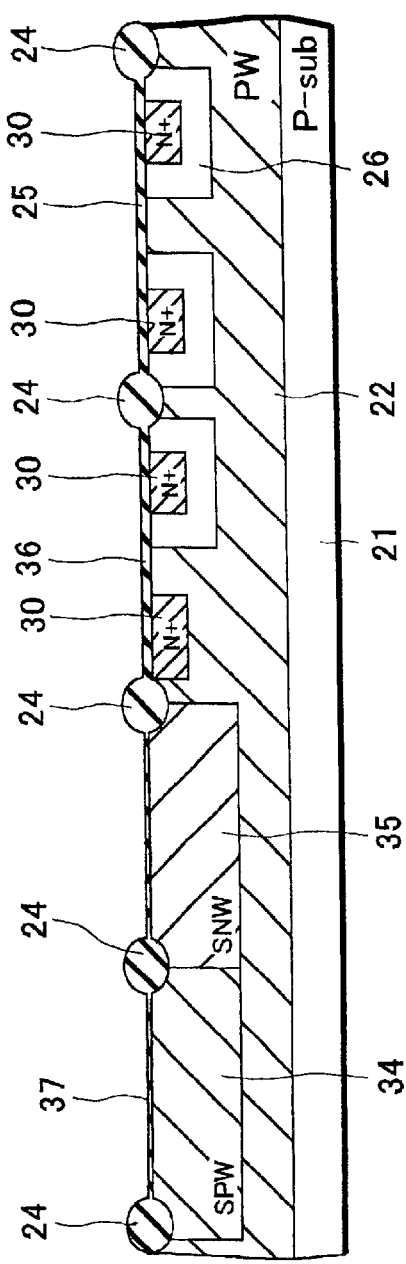
FIGS. 7A and 7B are sectional views showing a method for manufacturing a semiconductor device according to the embodiment of the invention.
Figure 7B:
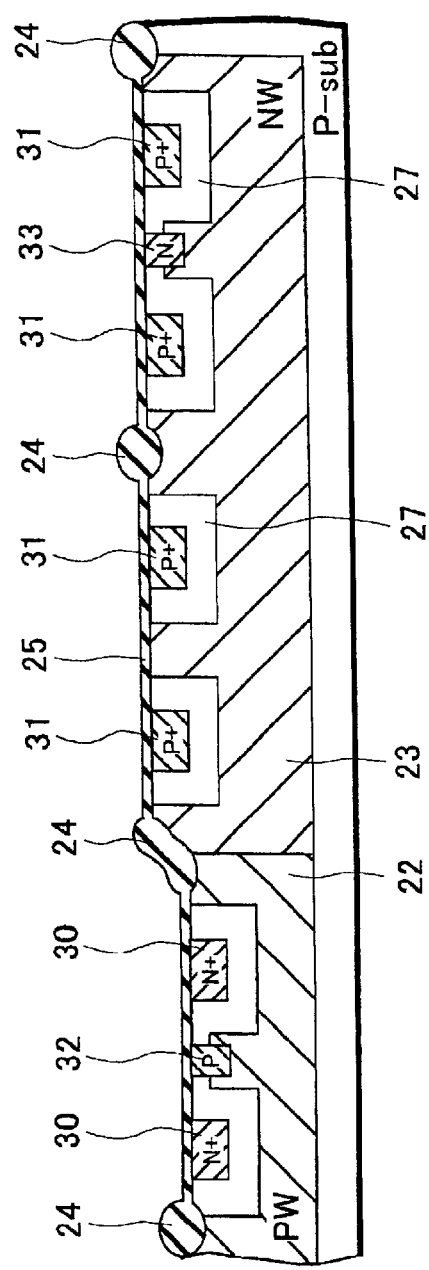

Next, removed is the oxide film 25 from the regions for N-channel and P-channel normal-voltage MOS transistors and for a level-shifter N-channel MOS transistor. Thereafter, as shown in FIGS. 7A and 7B, a gate oxide film having a desired film thickness is newly formed on the above region.

Namely, agate oxide film 36 is formed on the entire surface by thermal oxidation to approximately 14 nm (approximately 7 nm at this stage, but the film thickness will increase upon forming a gate oxide film for normal voltage referred later) for a level-shifter N-channel MOS transistor. Subsequently, after removing the gate oxide film 36 for a level-shifter N-channel MOS transistor formed on the region for N-channel and P-channel normal-voltage MOS transistors, a thin gate oxide film 37 (approximately 7 nm) for normal voltage is formed on this region by thermal oxidation.

Subsequently, in FIGS. 8A and 8B, a polysilicon film having approximately 100 nm is formed over the entire surface. The polysilicon film is thermally diffused by $POCl_3$ as a thermal-diffusion source thus being made conductive. Thereafter, a tungsten silicide film having approximately 100 nm are formed on the polysilicon film, and further an $SiO_2$ film having approximately 150 nm thereon. Using a not-shown resist film, patterning is made to form gate electrodes 38A, 38B, 38C, 38D, 38E, 38F, 38G for MOS transistors. Note that the $SiO_2$ film serves as a hard mask during the patterning.

Figure 9A:
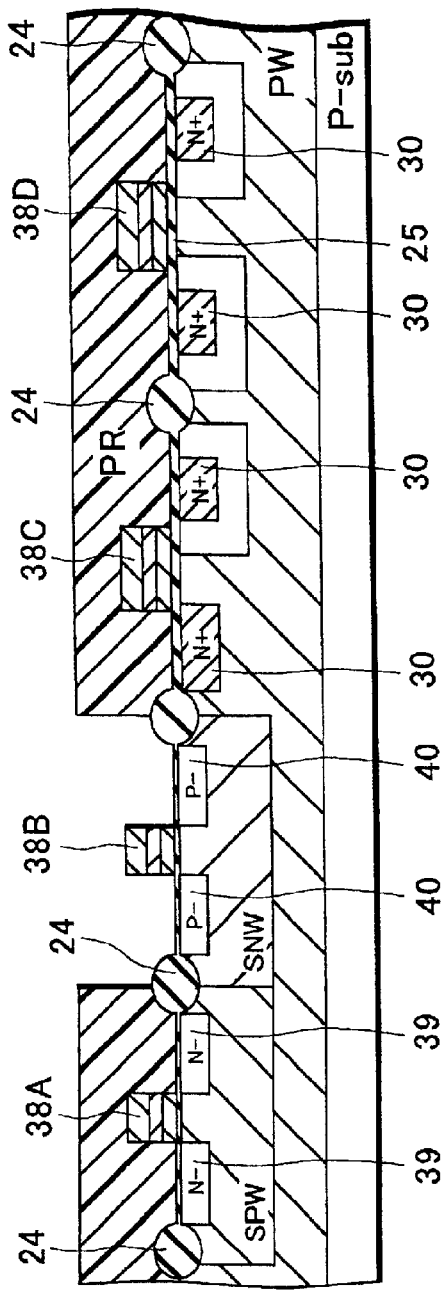
FIGS. 9A and 9B are sectional views showing a method for manufacturing a semiconductor device according to the embodiment of the invention.
Figure 9B:
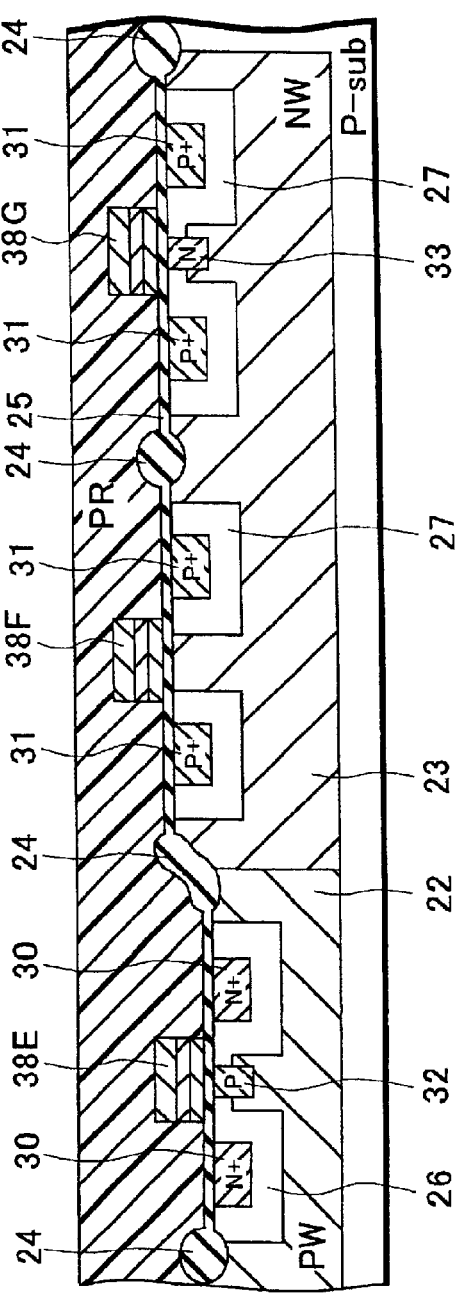

Subsequently, in FIGS. 9A and 9B, low-concentration sorce/drain regions are formed for normal-voltage N-channel and P-channel MOS transistors.

Namely, using as a mask a not-shown resist film covering the other region than the region for low-concentration source/drain regions for a normal-voltage N-channel MOS transistor, phosphorus ion, for example, is ion-implanted at an acceleration voltage of approximately 20 keV and a dose of $6.2 \times 10^{13}/cm^2$ to form low-concentration N-type source/drain regions 39. Meanwhile, using as a mask a resist film (PR) covering the other region than the region for a low-concentration source/drain region for a normal-voltage P-channel MOS transistor, boron difluoride ion, for example, is ion-implanted at an acceleration voltage of approximately 20 keV and a dose of $2 \times 10^{13}/cm^2$ to form low-concentration P-type source/drain regions 40.

Furthermore, as shown in FIGS. 10A and 10B, a TEOS film 41 having approximately 250 nm is formed over the entire surface by the LPCVD process in a manner covering the gate electrodes 38A, 38B, 38C, 38D, 38E, 38F, 38G. The TEOS film 41 is anisotropically etched through a mask of a resist film (PR) having openings in the region for normal-voltage N-channel and P-channel MOS transistors. This forms sidewall spacer films 41A on the sidewalls of the gate electrode 38A, 38B, as shown in FIG. 10A. The TEOS film 41 is left, as it is, in the region covered by the resist film (PR).

Then, using the gate electrode 38A, sidewall spacer films 41A, gate electrode 38B and sidewall spacer films 41A as a mask, high-concentration source/drain regions are formed for normal-voltage N-channel and P-channel MOS transistors.

Namely, using a not-shown resist film covering the other region than the region of high-concentration source/drain regions for a normal-voltage N-channel MOS transistor as a mask, arsenic ion, for example, is ion-implanted at an acceleration voltage of approximately 100 keV and a dose of $5 \times 10^{15}/cm^2$ thereby forming high-concentration N+ source/drain regions 42. Also, using a not-shown resist film covering the other region than the region of high-concentration source/drain regions for a normal-voltage P-channel MOS transistor as a mask, boron difluoride ion, for example, is ion-implanted at an acceleration voltage of approximately 40 keV and a dose of $2 \times 10^{15}/cm^2$ thereby forming high-concentration P+ source/drain regions 43.

An interlayer insulating film, including TEOS and BPSG films, is formed to approximately 600 nm and, thereafter, a metal interconnection layer is formed to have contact to the source/drain regions 30, 31, 42, 43. Thus, completed are normal-voltage N-channel and P-channel MOS transistors, a level-shifter N-channel MOS transistor, high-voltage N-channel and P-channel MOS transistors, and high-voltage N-channel and P-channel SLEDMOS transistors reduced in on-resistance, to constitute the organic EL display driver.

Here, the invention discloses an efficient pattern layout method at making an anode driver, a cathode driver, a memory portion memorizing display data etc., a controller, and the like in one chip in an organic EL display driver which supplies constant current to an organic EL element (organic electroluminescent element), and makes the organic EL element emit light.

(Embodiment 1)

Outline about pattern layout constitution of the first embodiment will be described below with reference to drawings.

Figure 11A:
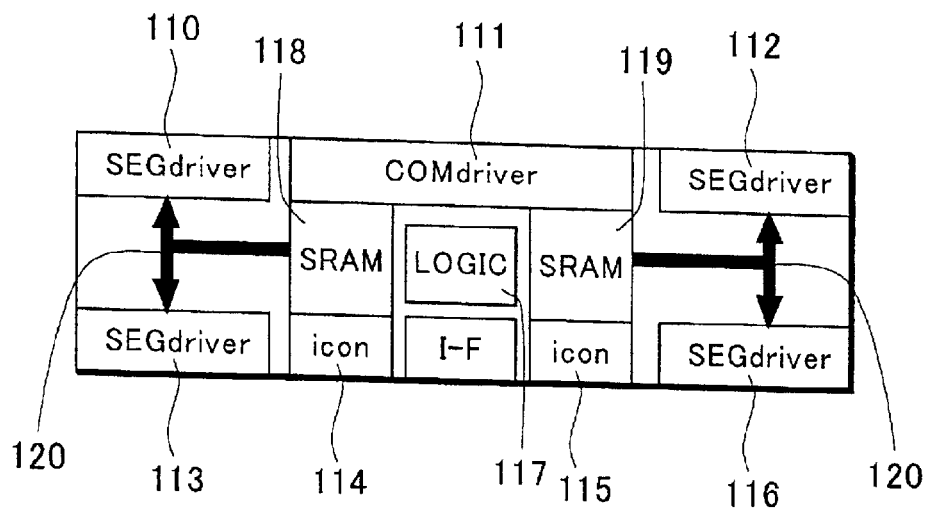
FIGS. 11A and 11B are plane views showing a pattern layout of a semiconductor device according to the first embodiment of the invention.

In FIG. 11A, making the anode driver, the cathode driver, the memory, the controller, and the like in one chip, the following regions are arranged: from upper left of the paper, anode driver region 110 of 32 bits (segment: SEG); cathode driver region 111 of 128 bits (common: COM); and anode driver region 112 of 32 bits (SEG); and from lower left of the paper, anode driver region 113 of 32 bits (SEG); anode driver region 114 for icon of 10 bits (icon SEG); anode driver region 115 for icon of 10 bits (icon SEG); and anode driver region 116 of 32 bits (SEG). Each of driver regions constitutes desired output bit group by arranging repeatedly output region corresponding to one bit output at times of numbers of required outputs.

SRAMs (Static Random Access Memory) 118 and 119 as memory portions are arranged at symmetric positions through another logic portion 117 in the center portion, and output wiring 120 from the SRAMs 118 and 119 is connected to each of the anode driver regions 110, 112, 113, and 116. These may be symmetric positions of high and low putting depending on the arrangement in the chip though symmetry of right and left in this embodiment.

Thus in the invention, drawing the wiring 120 around becomes easy by arranging the anode drivers connected to the SRAMs at four corners in the chip, dividing the SRAMs into two parts putting together with each of anode drivers 110, 112, 113, and 116, and corresponding a group of the anode driver regions 110 and 113 arranged at left end portion of the chip to a group of the anode driver regions 112 and 116 arranged at right end portion of the chip respectively.

Figure 16:
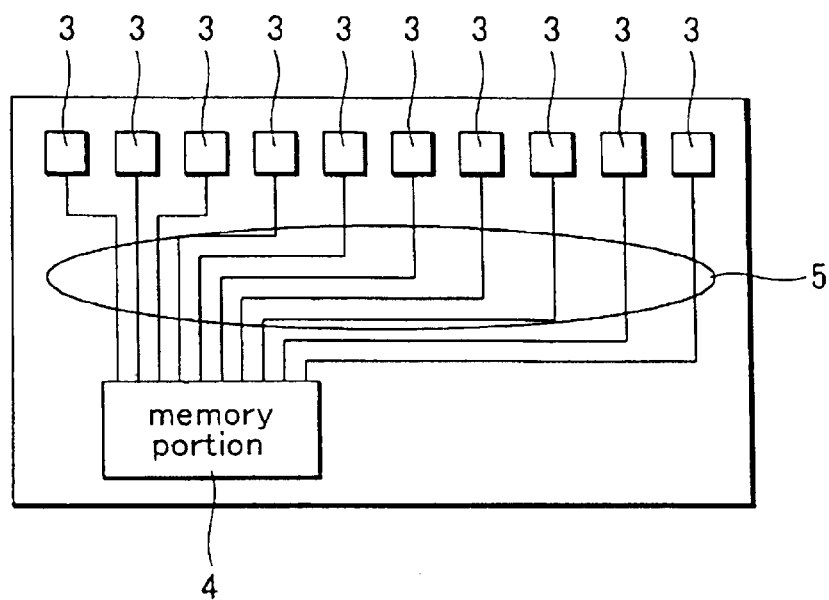
FIG. 16 is a plane view showing a pattern layout of the conventional semiconductor device.
Figure 17A:
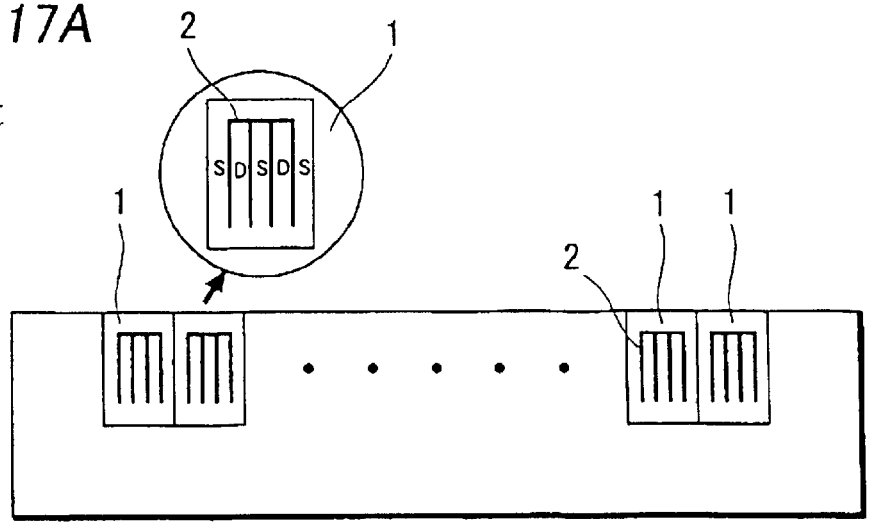
FIG. 17 is a plane view showing a pattern layout of the conventional semiconductor device.
Figure 17B:
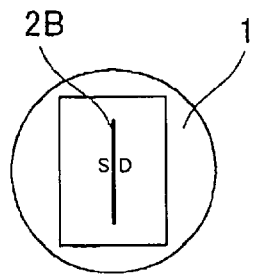
Figure 17C:
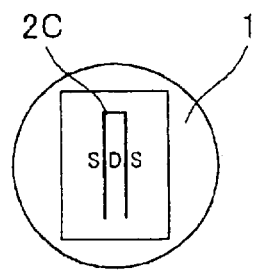
Figure 17D:
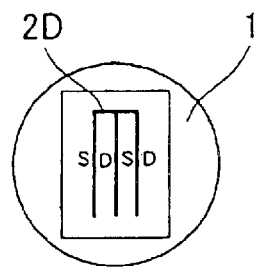

That is, to describe with comparison of the conventional constitution (FIG. 16) and the above-mentioned constitution of FIG. 11A, when output pads 3 corresponding to all drivers are arranged in one line in the chip as shown in FIG. 16, space of drawing wiring 5 around (region encircled with a circle in FIG. 16) is required so that chip size increases for the space because the wiring 5 is drawn around to each output pad 3 from the memory portion 4 arranged at one position.

On the contrary, in the invention, space of drawing around is small because of arranging the drivers (anode driver in this embodiment) connected to the SRAMs at four corners in the chip, dividing the SRAMs into two parts putting together with each of anode drivers 110, 112, 113, and 116, and wiring each of the anode driver regions 110, 112, 113, and 116 to the SRAMs 118 and 119.

Figure 11B:
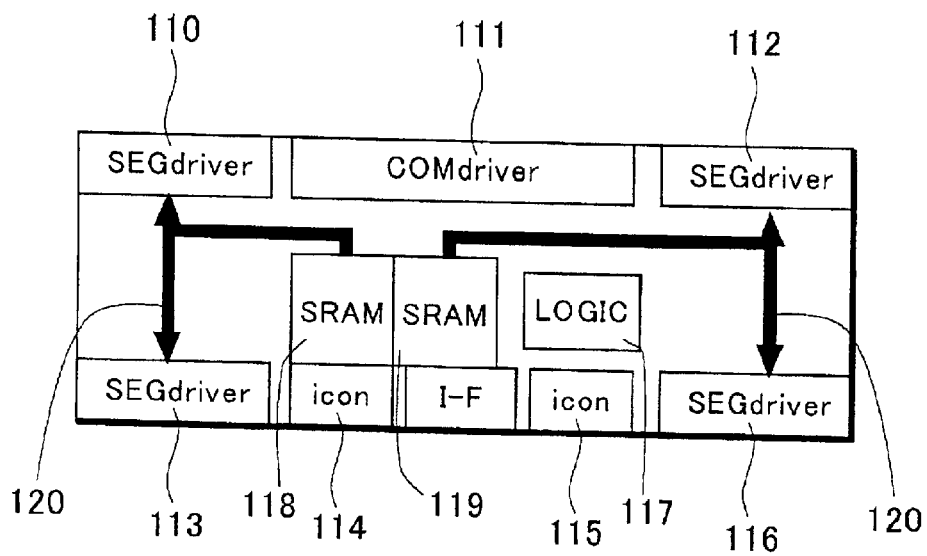

Further, to describe with comparison of the constitution shown in FIG. 11B and the above-mentioned constitution of FIG. 11A, in the constitution shown in FIG. 11B, the driver (anode driver in this embodiment) connected to the SRAMs similarly as the constitution of FIG. 11A. However, space of drawing the wiring 120 around becomes large as compared with the constitution of the above-mentioned FIG. 11A, but small as compared with constitution of the above-mentioned FIG. 16 because the SRAMs (118 and 119) connected to each of anode driver regions 110, 112, 113, and 116 are arranged at one position.

Moreover, since constitution of FIG. 11A is symmetry of right and left in length of wiring, influence caused by impedance is reduced as compared with constitution of FIG. 16 so that uneven of display can be depressed.

As described above, when the organic EL display driver having the anode driver, the cathode driver, the memory portion and the controller is made in one chip, miniaturization of the chip size is designed and low cost becomes possible by dividing the memory portion into two parts because wiring length of drawing around at connecting the memory portion and each driver.

Although the anode driver regions 110, 112, 113, and 116 connected to the memory portions are arranged equally at four corners of the chip so as to divide the anode driver regions 110, 112, 113, and 116 into two groups, and the memory portions are divided into two parts (SRAMs 118 and 119) so as to correspond to each group in the mode for carrying out, the memory portions may be subdivided.

(Embodiment 2)

The pattern layout constitution of the second embodiment of the invention will be described referring the drawings. The description of similar constitution as the background art (FIGS. 17A to 17D) is omitted adding the same symbols to avoid repeated description.

Figure 12:
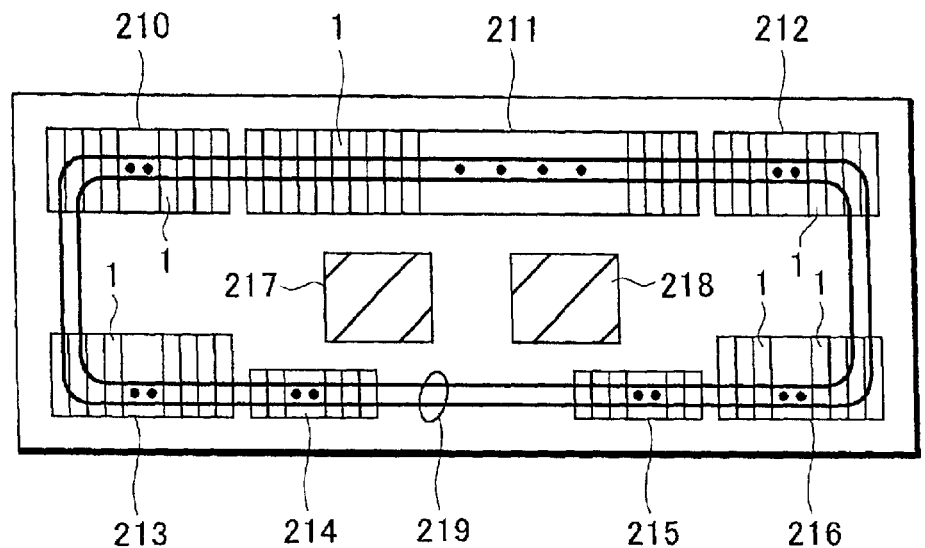
FIG. 12 is a plane view showing a pattern layout of a semiconductor device according to the second embodiment of the invention.

In FIG. 12, numeral 1 denotes output region corresponding to output one bit, and layout of a semiconductor device constituting various kinds of drivers such as a driver for driving an organic EL display and the like constitutes desired output group by arranging the output region 1 for one bit repeatedly times of necessary outputs.

In the output region 1 for one bit, wiring for gate electrode is formed similarly as FIGS. 17A to 17D.

In this embodiment, the following regions are arranged: from upper left of the paper, anode driver region 210 of 32 bits (segment: SEG); cathode driver region 211 of 128 bits (common: COM); and anode driver region 212 of 32 bits (SEG); and from lower left of the paper, anode driver region 213 of 32 bits (SEG); anode driver region 214 for icon of 10 bits (icon SEG); anode driver region 215 for icon of 10 bits (icon SEG); and anode driver region 216 of 32 bits (SEG) making the anode driver, the cathode driver, the memory, the controller, and the like in one chip. Each of driver regions constitutes desired output bit group by arranging repeatedly output region 1 corresponding to one bit output times of numbers of required outputs.

Thus in the invention, each of driver regions (an anode driver region 210, a cathode driver region 211, an anode driver region 212, an anode driver region 213, an anode driver region 214 for icon, an anode driver region 215 for icon, and an anode driver region 216) is arranged equally at periphery portion in the chip, and at almost center portion of the chip, memory portions 217 and 218 memorizing display data etc., controller, and the like are arranged. Wiring 219 of power source line, signal line, and the like are drawn around each driver region, and the wiring 219 is connected at every output region for one bit.

As described above, at making the anode driver, the cathode driver, the memory portion, the controller and the like in one chip, driver outputs can be arranged to all of four directions, for example, by drawing wiring 219 of the power source line, the signal line, and the like around fitting the to shape of the chip.

Figure 13:
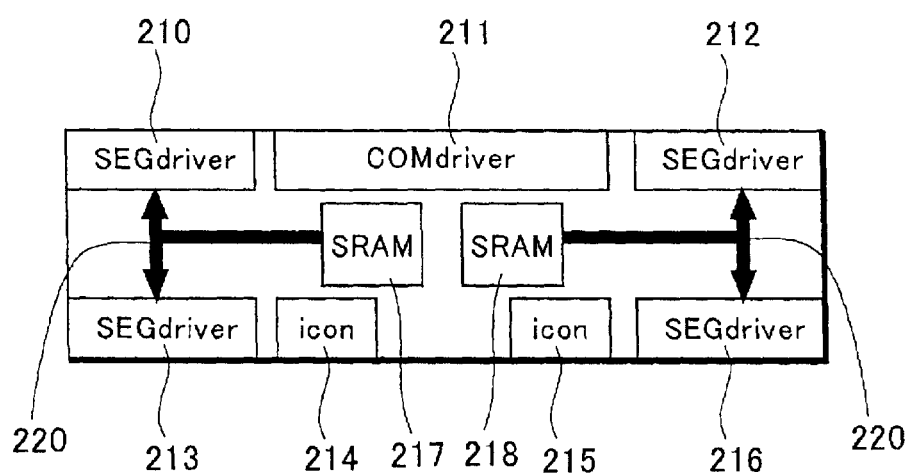
FIG. 13 is a plane view showing a pattern layout of a semiconductor device according to the second embodiment of the invention.

By arranging the memory portion, the controller, and the like at the center portion of the chip, efficiency of wiring becomes good so as to design miniaturization of chip size. That is, memory portions 217 and 218 including SRAMs are arranged at symmetric positions of the center portion of the chip as shown in FIG. 13, and output wiring 220 from the memory portions 217 and 218 is connected to each of the anode driver regions 210, 212, 213, and 216. These may be symmetric positions of high and low putting depending on arrangement in the chip though symmetry of right and left in this embodiment.

Thus in the invention, drawing the wiring 220 around becomes easy by arranging the drivers (the anode drivers in this embodiment) connected to the memory portions 217 and 218 to four directions of the periphery portion in the chip, dividing the memory portions into two parts putting depending on each of anode drivers 210, 212, 213, and 216, and corresponding a group of the anode driver regions 210 and 213 arranged at left end portion of the chip to a group of the anode driver regions 212 and 216 arranged at right end portion of the chip respectively. By reduction of the space of drawing around, miniaturization of chip size is designed for the reduction.

Figure 14A:
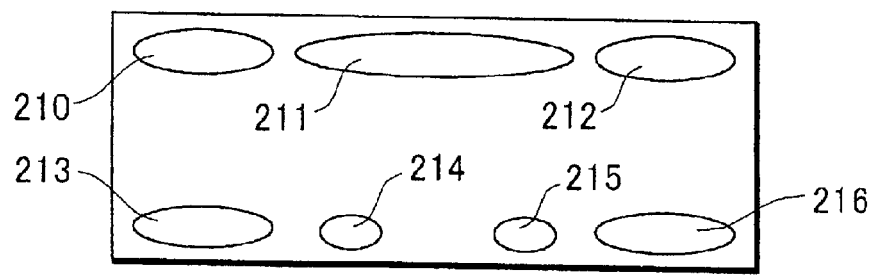
FIGS. 14A to 14D are plane views showing a pattern layout of a semiconductor device according to the second embodiment of the invention.

Another layout method of each driver region arranged in the chip will be described referring FIGS. 14A to 14D. FIG. 14A shows the pattern layout shown in FIG. 13 typically, and the variations of arrangement of FIG. 14A are arrangement of FIGS. 14B, 14C, and 14D described below. Memory portions are omitted for convenience.

Figure 14B:
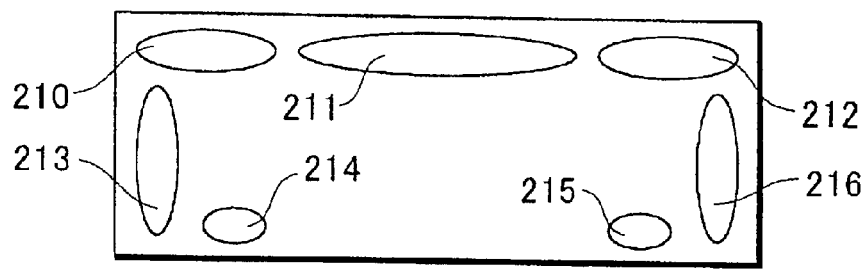

First, in the arrangement example shown in FIG. 14B, anode driver regions 213 and 216 placed face to face respectively at upper and lower position against the driver regions 210 and 212 with respect to the paper face are arranged to be adjacent respectively to the anode driver regions 210 and 212 in 90 degrees, and anode driver regions 214 and 215 for icon are arranged to be adjacent respectively to the driver regions 213 and 216. Thus, comparatively wide region of lower side of the chip against becomes vacant so that degree of freedom at arrangement of another logic portion, controller, and the like increases.

Figure 14C:
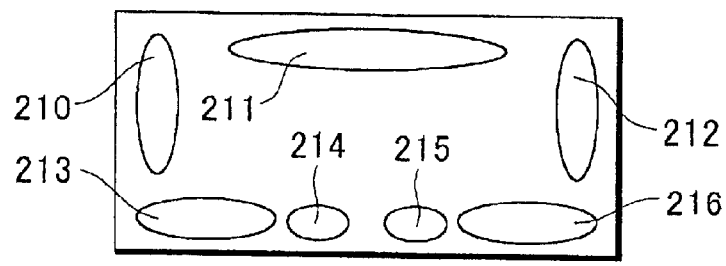

Further, in the arrangement example shown in FIG. 14C, anode driver regions 214 and 215 for icon and anode driver regions 213 and 216 are arranged in the vicinity respectively in FIG. 14A, and anode driver regions 210 and 212 are arranged so as to be adjacent 90 degrees respectively to the anode driver regions 213 and 216. Thus, chip size can be miniaturized as compared with arrangements of FIGS. 14A and 14B.

Figure 14D:
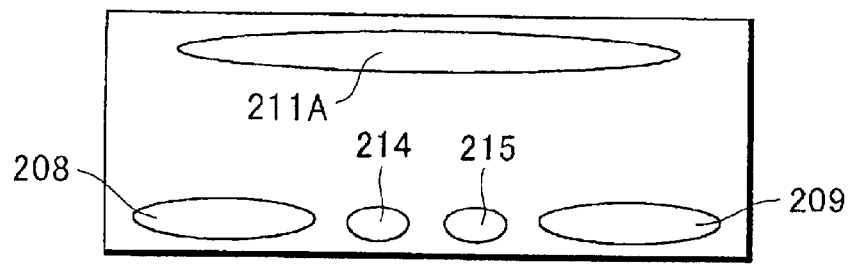

Moreover, in the arrangement example shown in FIG. 14D, chip size is similar as chip sizes shown in FIGS. 14A and 14B so that further multi bits are designed but the arrangement example shown in FIG. 14C is better in miniaturization than the arrangement example shown in FIG.

14D. Numerals 208, 209, and 211A denotes an anode driver region and a cathode driver region made in more multi bits than the anode driver region and the cathode driver region in the above-mentioned FIGS. 14A, 14B, and 14C respectively.

(Embodiment 3)

The pattern layout constitution of the third embodiment of the invention will be described referring the drawings. The description of similar constitution as the background art (FIGS. 17A to 17D) is omitted adding the same symbols to avoid repeated description.

The third embodiment has a feature in the semiconductor device and pattern layout method thereof with the object of designing improvement of precision of finishing shape and working dimension of the each of gate electrode.

Figure 15:
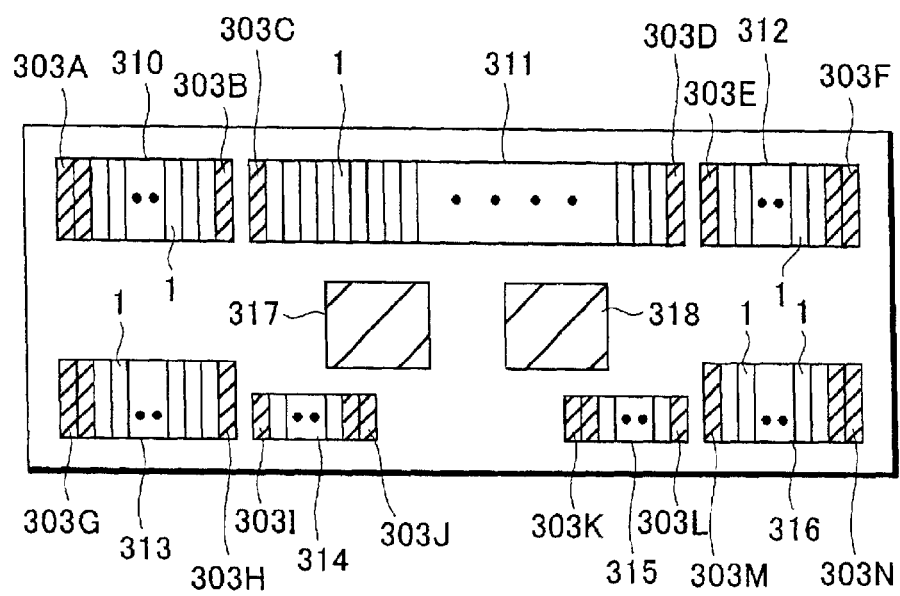
FIG. 15 is a plane view showing a pattern layout of a semiconductor device according to the third embodiment of the invention.

FIG. 15 is a view showing pattern layout of the third embodiment applied to an organic EL display driver.

In FIG. 15, numeral 1 denotes output region corresponding to one bit, and pattern layout of a semiconductor device for various kinds of drivers such as a display driver and the like constitutes desired output bit group by arranging repeatedly the output regions 1 for one bit with times of numbers of required output are arranged to have desired numbers of output.

Similar to the conventional output region, wiring for gate electrode is formed in the output region 1 for one bit, and source region and drain region are formed to be adjacent to the wiring for gate electrode.

Symbol 303A to 303N is dummy patterns which is a feature of this embodiment, and the dummy patterns 303A to 303N are formed to be adjacent to an end portion of the output bit group where the output region 1 for one bit is arranged repeatedly. In the dummy patterns 303A to 303N, wiring for the dummy gate electrode having the same shape as the wiring for gate electrode formed in the output region 1 for one bit is formed. Here, source region and drain region corresponding to the wiring for the dummy gate electrode of are not constituted.

Here, as the above-mentioned display driver for driving display, there is an organic EL display driver and the like having an anode driver and a cathode driver for example, supplying constant current to an organic EL element (an organic electroluminescent element), and makes the organic EL element emit light. When the driver for driving organic EL display driver having the anode driver, the cathode driver, a memory, a controller, and the like are made in one chip, each driver portion is mounted mixedly naturally. Therefore, the above-mentioned difference between fineness and roughness of the gate electrode forming pattern becomes large, micro-loading effect generates easily at photolithography and etching, dispersion variation of finishing shape and working dimension of the gate electrode caused by the effect becomes large, and problem being out of order in display generates.

Then, in the invention, making the anode driver, the cathode driver, the memory, the controller, and the like in one chip, the following regions are arranged: from upper left of the paper, anode driver region 310 of 32 bits (segment: SEG); cathode driver region 311 of 128 bits (common: COM); and anode driver region 312 of 32 bits (SEG); and from lower left of the paper, anode driver region 313 of 32 bits (SEG); anode driver region 314 for icon of 10 bits (icon SEG); anode driver region 315 for icon of 10 bits (icon SEG); and anode driver region 316 of 32 bits (SEG). Each of driver regions constitutes desired output bit group by arranging repeatedly output region 1 corresponding to one bit output at times of numbers of required outputs.

At one end portion (the end side of the pattern) of the anode driver region 310 of 32 bits (SEG), SEG dummy pattern 303A for 2 bits (two pieces of the output region 1) is arranged, and at another end portion (center side of the pattern), SEG dummy pattern 303B for one bit is arranged. At one end portion (the SEG dummy pattern 303B side) of the cathode driver region 311 of 128 bits (COM), COM dummy pattern 303C for one bit is arranged to be adjacent to the SEG dummy pattern 303B, and even at another end portion, COM dummy pattern 303D for one bit is arranged. Further, at one end portion (the SEG dummy pattern 303D side) of the anode driver region 312 of 32 bits (SEG), SEG dummy pattern 303E for one bit is arranged to be adjacent to the COM dummy pattern 303D, and at another end portion (end side of the pattern), SEG dummy pattern 303F for 2 bits is arranged.

At one end portion (the end side of the pattern) of the anode driver region 313 of 32 bits (SEG), SEG dummy pattern 303G for 2 bits is arranged, and at another end portion (center side of the pattern), SEG dummy pattern 303H for one bit is arranged. At one end portion (the SEG dummy pattern 303H side) of the cathode driver region 314 of 10 bits (icon SEG), icon SEG dummy pattern 303I for one bit is arranged to be adjacent to the SEG dummy pattern 303H, and even at another end portion, icon SEG dummy pattern 303J for 2 bits is arranged. Further, at one end portion (the center side of the pattern) of the anode driver region 315 for icon of 32 bits (icon SEG), icon SEG dummy pattern 303K for 2 bits is arranged, and at another end portion (the anode driver region 316 of 32 bits (SEG) side), icon SEG dummy pattern 303L for one bit is arranged. At one end portion (the SEG dummy pattern 303L side) of the anode driver region 316 of 32 bits (SEG), SEG dummy pattern 303M for one bit is arranged, and at another end portion (the end side of the pattern), SEG dummy pattern 303N for 2 bits is arranged.

Numerals 317 and 318 denote memories arranged at a pattern center portion and memorizing display data and the like.

At this time, working precision is improved by forming a dummy pattern of the same shape as each output bit at the end portion at every each output bit group in this embodiment.

Further, by applying the invention for display driver and the like having an anode driver, a cathode driver, and so on, variation of working precision can be depressed even at making them in one chip. Therefore, michronization and low cost are designed comparing the conventional driver having them separately by making in one chip.

Furthermore, each dummy pattern does not formed evenly (i.e. the same output number), but number of output (one bit in this embodiment) of dummy pattern arranged at the region where adjacent output bit group exists is made less than number of output (2 bits in this embodiment) of the dummy pattern arranged at the region where adjacent output bit group does not exist.

Thus, when output bit group adjacent to end portion of output bit group does not exist, dummy pattern for 2 bits is arranged for example in the invention. When the output bit group adjacent exists, effectual use of pattern is designed without vain increasing of pattern area by arranging dummy pattern for one bit for example at every output bit group adjacent (i.e. joining each dummy pattern formed at every output bit pattern adjacent becomes a pattern for 2 bits). Even in the case that output bit group adjacent exists, dummy pattern of the same number (pattern for 2 bits for example) as in the case that output bit group adjacent does not exist at end portion of the output bit group may be arranged.

Further, if there is an empty space not patterned in region where plural output bit regions are arranged, not only forming the dummy pattern at the end portion of the output bit group, a dummy pattern may be formed in the empty space. Thus in the invention, the dummy pattern maybe arranged at desired position with desired rate considering relation of fineness and roughness of working pattern.

Although a driver for driving the organic EL display for display is described as an example in the above embodiments, the invention is not limited to this. The invention is applicable to drivers for various kinds of flat panel display such as an LCD, an LED display, an inorganic EL display, a PDP (Plasma Display Panel), an FED (Field Emission Display), and so on for example, and is possible to apply for use that circuits are inserted repeatedly and number of bits is determined as the need arises. Further, provision of the dummy pattern described in the third embodiment is applicable to the semiconductor device of the first and second embodiments.

According to the invention, at first, at making the driver for driving display having the anode driver, the cathode driver, the memory, and the like in one chip, the driver regions connected to the memory portions are laid out equally in the chip, and the memory portions are arranged in divided parts corresponding to each region laid out equally. Because of that, drawing of wiring between the memory portions and the drivers becomes easy, and miniaturization of the chip size can be designed because length of wiring at the memory portions becomes short.

Second, space of drawing wiring around is miniaturized by arranging driver regions equally at periphery portion in the chip, drawing wiring such as power source line, signal line, and the like around each driver region. By arranging the memory portion etc. at center portion of the chip, efficiency of wiring become good so as to design miniaturization of chip size.

Further, by applying the invention for a driver for driving display having an anode driver, a cathode driver, and the like, these can be made in one chip so as to design miniaturization and low cost.

Third, working precision can be improved by forming the dummy pattern at the end portion of the output bit group.

By applying to the display driver having the anode driver, the cathode driver, and the like, it is possible to make them in one chip so that michronization and low cost are designed.

Further, there is not vain increasing of pattern area by arranging number of output of the dummy pattern arranged at region where output bit group adjacent exists less than number of output of the dummy pattern arranged at region where the output bit group adjacent does not exist.

What is claimed is:

1. A pattern layout method of a semiconductor made in one chip with an anode driver, a cathode driver, and memory portions comprising:
    laying out drivers connected to the memory portions equally in the chip, said drivers include a plurality of output regions;
    arranging each memory portion equally in a vicinity of each of the drivers; and
    forming a dummy pattern adjacent an output bit group and having a shape equivalent to the output regions.

2. The pattern layout method according to claim 1, wherein desired drivers connected to the memory portions are divided into plural groups and each of the memory portions is provided in every group.

3. The pattern layout method according to claim 1, wherein the drivers connected to the memory portions are placed face to face at right and left positions or top and bottom positions, and each memory portion is arranged at a center portion of the chip.

4. The pattern layout method according to claim 1, wherein the plurality of output regions constitute the output bit group, and each output region corresponds to one bit.

5. The pattern layout method according to claim 4, wherein the dummy pattern is formed at an empty space in a region where a plurality of output bit groups are arranged.

6. The pattern layout method according to claim 4, wherein number of outputs of the dummy pattern formed at a region where output bit groups are adjacent to each other is less than number of outputs of the dummy pattern formed at a region where output bit groups are not adjacent each other.

7. The pattern layout method according to claim 4, wherein the dummy pattern has a shape equivalent to a wiring for gate electrode.

8. A pattern layout method of a semiconductor device constituting drivers for driving display where drivers, memory portions are made in one chip, the drivers arranging plural output regions corresponding to one bit to constitute output bit groups, the method comprising:
    arranging the drivers at periphery portion in the chip in a state of grouping by every desired output bit group; and
    arranging wirings connected to each output bit group of the drivers, the wirings are disposed peripherally to circle around within the chip; and
    forming a dummy pattern adjacent the output bit groups and having a shape equivalent to the output regions.

9. The pattern layout method according to claim 8, wherein the dummy pattern is formed at an empty space in a region where a plurality of output bits are disposed.

10. The pattern layout method according to claim 8, wherein number of outputs of the dummy pattern formed at a region where output bit groups are adjacent to each other is less than the number of outputs of the dummy pattern formed at a region where output bit groups are not adjacent each other.

11. The pattern layout method according to claim 8, wherein the dummy pattern has a shape equivalent to a wiring for gate electrode.

12. A pattern layout method for a semiconductor chip comprising:
    laying out an anode driver and a cathode driver equally in the semiconductor chip, each of said drivers containing a plurality of output regions constituting an output bit group, and each output region corresponding to one bit;
    providing a memory portion for each of the drivers; and
    forming a dummy pattern adjacent the output bit group, said dummy pattern having a shape equivalent to the output region.

13. A pattern layout method for a semiconductor chip comprising:
    disposing drivers at periphery portions of the semiconductor chip, each driver with a plurality of output regions, which constitutes an output bit group, and said output region corresponding to one bit;
    providing wirings for connecting each output bit group of the drivers, the wirings are peripherally disposed to circle around within the chip; and
    forming a dummy pattern adjacent the output bit groups and having a shape equivalent to the output regions.

14. The pattern layout method according to claim 13, wherein the drivers includes an anode driver and a cathode driver, and the drivers are arranged at periphery portions in the chip in a state that one of the anode driver and the cathode driver is grouped by every desired output bit group.

15. The pattern layout method according to claim 13, wherein the wirings include a power source line and a signal line.

16. The pattern layout method according to claim 13 wherein each of the output bit groups surrounds memory portions.

17. The pattern layout method according to claim 13, further comprising:

provided memory portions approximately in the center of the semiconductor chip.

* * * * *